(12) United States Patent
Liu et al.

(10) Patent No.: US 12,628,339 B2
(45) Date of Patent: May 12, 2026

(54) RESISTOR BETWEEN DUMMY FLASH STRUCTURES

(71) Applicant: UNITED MICROELECTRONICS CORP., Hsin-Chu (TW)

(72) Inventors: Weichang Liu, Singapore (SG); Wang Xiang, Singapore (SG); Chia Ching Hsu, Singapore (SG); Yung-Lin Tseng, Changhua County (TW); Shen-De Wang, Hsinchu County (TW)

(73) Assignee: UNITED MICROELECTRONICS CORP., Hsin-Chu City (TW)

( * ) Notice: Subject to any disclaimer, the term of this patent is extended or adjusted under 35 U.S.C. 154(b) by 425 days.

(21) Appl. No.: 18/135,712

(22) Filed: Apr. 17, 2023

(65) Prior Publication Data
US 2024/0315017 A1 Sep. 19, 2024

(30) Foreign Application Priority Data
Mar. 17, 2023 (CN) .......................... 202310260845.3

(51) Int. Cl.
| | |
|---|---|
| *G11C 27/00* | (2006.01) |
| *H10B 41/30* | (2023.01) |
| *H10D 1/47* | (2025.01) |
| *H10D 30/01* | (2025.01) |
| *H10D 30/68* | (2025.01) |
| *H10D 64/01* | (2025.01) |

(52) U.S. Cl.
CPC .............. *H10B 41/30* (2023.02); *H10D 1/47* (2025.01); *H10D 30/0411* (2025.01); *H10D*

*30/681* (2025.01); *H10D 30/6892* (2025.01); *H10D 64/035* (2025.01)

(58) Field of Classification Search
CPC .............. H10B 41/30; H10D 30/0411; H10D 30/6892; H10D 1/47; H10D 64/035; H10D 30/681
USPC .......................................................... 365/46
See application file for complete search history.

(56) References Cited

U.S. PATENT DOCUMENTS

| | | | | |
|---|---|---|---|---|
| 8,058,125 | B1 * | 11/2011 | Lin ...................... | H10D 84/811 |
| | | | | 438/238 |
| 8,361,848 | B2 * | 1/2013 | Lee ...................... | H10D 30/797 |
| | | | | 438/510 |
| 8,901,663 | B2 * | 12/2014 | Choi ........................ | H10D 1/47 |
| | | | | 257/369 |
| 9,209,197 | B2 * | 12/2015 | Ramsbey ............. | H10D 30/681 |
| 9,356,018 | B2 * | 5/2016 | Song ...................... | H10D 30/60 |
| 9,412,883 | B2 * | 8/2016 | Wang ...................... | H10D 1/47 |
| 10,163,921 | B2 * | 12/2018 | Mihara ............. | H10D 30/6215 |
| 11,188,237 | B2 * | 11/2021 | Tran ...................... | G06F 3/0637 |
| 11,545,484 | B2 * | 1/2023 | Lu .......................... | G06F 30/392 |
| 11,690,227 | B2 * | 6/2023 | Chen ...................... | H10D 64/62 |
| | | | | 438/275 |

(Continued)

*Primary Examiner* — Viet Q Nguyen
(74) *Attorney, Agent, or Firm* — Winston Hsu

(57) ABSTRACT
A resistor between dummy flash structures includes a substrate. The substrate includes a resistor region and a flash region. A first dummy memory gate structure and a second dummy memory gate structure are disposed within the resistor region of the substrate. A polysilicon resistor is disposed between the first dummy memory gate structure and the second dummy memory gate structure. The polysilicon resistor contacts the first dummy memory gate structure and the second dummy memory gate structure.

20 Claims, 6 Drawing Sheets

(56)         References Cited

U.S. PATENT DOCUMENTS

| | | | | |
|---|---|---|---|---|
| 2009/0051008 | A1* | 2/2009 | Shin ..................... | H10D 84/811 |
| | | | | 257/536 |
| 2011/0266637 | A1* | 11/2011 | Lee ...................... | H10D 30/797 |
| | | | | 257/E21.409 |
| 2012/0299115 | A1* | 11/2012 | Chuang ............... | H10D 62/115 |
| | | | | 257/E21.546 |
| 2013/0270647 | A1* | 10/2013 | Zhu ..................... | H10D 84/038 |
| | | | | 257/E21.639 |
| 2013/0299115 | A1* | 11/2013 | Epale ...................... | B21J 5/002 |
| | | | | 164/37 |
| 2016/0020148 | A1* | 1/2016 | Song ................. | H10D 84/0149 |
| | | | | 438/238 |
| 2016/0190229 | A1* | 6/2016 | Singh ................ | H10D 84/0158 |
| | | | | 257/380 |
| 2016/0211860 | A1* | 7/2016 | Isozaki ............... | H03M 1/0651 |
| 2019/0019792 | A1* | 1/2019 | Tung ...................... | H10D 86/01 |
| 2019/0148361 | A1* | 5/2019 | Lu ........................ | H10D 84/811 |
| | | | | 257/379 |
| 2020/0105746 | A1* | 4/2020 | Olac-Vaw ............ | H10D 64/017 |
| 2021/0335991 | A1* | 10/2021 | Huang ................ | H01L 23/647 |
| 2021/0357561 | A1* | 11/2021 | Yu ........................ | G06F 30/3312 |
| 2023/0230974 | A1* | 7/2023 | Zhu .......................... | H10D 1/47 |
| | | | | 257/360 |
| 2023/0378244 | A1* | 11/2023 | Chen ....................... | H10D 1/47 |
| 2024/0206183 | A1* | 6/2024 | Chen .................... | H10D 64/017 |

* cited by examiner

RESISTOR BETWEEN DUMMY FLASH STRUCTURES

BACKGROUND OF THE INVENTION

1. Field of the Invention

The present invention relates to a resistor, and more particularly to a resistor disposed between dummy flash structures.

2. Description of the Prior Art

A resistor is a passive electronic component which is used to limit current flow passing through a circuit. A resistor works by converting electrical energy into heat to reduce the current flow through the resistor. Resistors are present in almost all electronic circuits and are critical in controlling current and voltage in a circuit.

In the modern semiconductor industry, resistors are used in analog circuits such as filters, amplifiers, digital-to-analog converters and analog-to-digital converters. Currently, resistors are formed by implanting or diffusing ions in to substrate regions. However, such resistors occupied a lot of space. In addition, temperature has a strong influence on the resistance value of these resistors. Therefore, there is a need for a resistor which has smaller size, simpler manufacturing process and more stable performance.

SUMMARY OF THE INVENTION

In view of this, a polysilicon resistor between dummy flash structures is provided. The polysilicon resistor is formed along with the fabricating process of a split-gate memory, and the polysilicon resistor has a smaller size comparing to conventional resistors formed by doping or diffusion.

According to a preferred embodiment of the present invention, a resistor between dummy flash structures includes a substrate includes a resistor region and a flash region. A first dummy memory gate structure and a second dummy memory gate structure are disposed within the resistor region of the substrate. A polysilicon resistor is disposed between the first dummy memory gate structure and the second dummy memory gate structure, and the polysilicon resistor contacts the first dummy memory gate structure and the second dummy memory gate structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 2 to FIG. 5 depict a fabricating method of a resistor between dummy flash structures according to a preferred embodiment of the present invention, wherein:

FIG. 2 depicts a substrate with dummy memory gate structures and memory gate structures thereon;

FIG. 3 shows a continuous stage of FIG. 2;

FIG. 4 shows a continuous stage of FIG. 3;

FIG. 5 shows a continuous stage of FIG. 4; and

DETAILED DESCRIPTION

Figure 1:
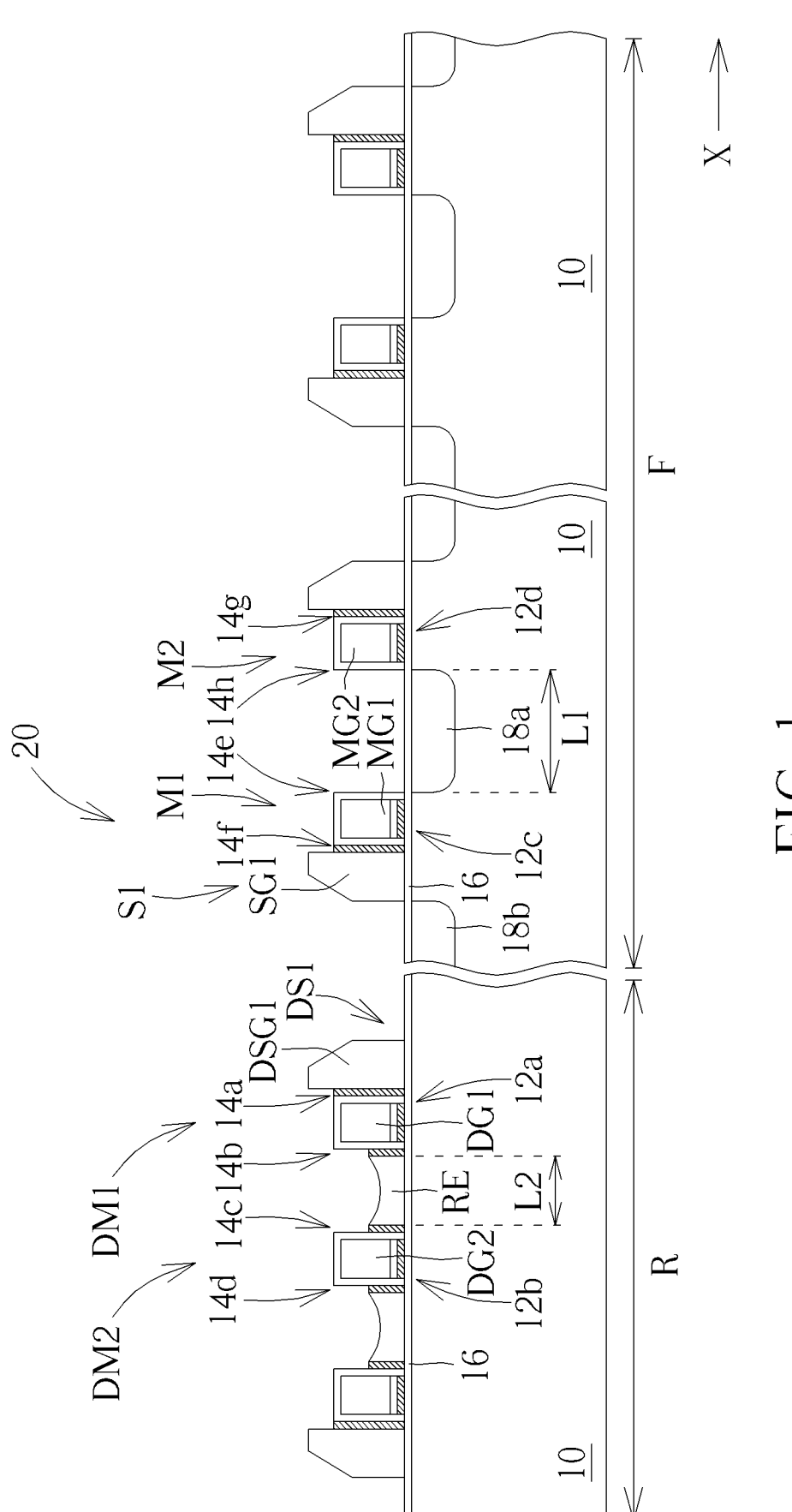
FIG. 1 depicts a resistor between dummy flash structures according to a preferred embodiment of the present invention.

FIG. 1 depicts a resistor between dummy flash structures according to a preferred embodiment of the present invention.

As shown in FIG. 1, a resistor between dummy flash structures includes a substrate 10. The substrate 10 is divided into a resistor region R and a flash region F. Numerous dummy memory gate structures such as a first dummy memory gate structure DM1 and a second dummy memory gate structure DM2 are disposed within the resistor region R of the substrate 10. The first dummy memory gate structure DM1 includes a first dummy memory gate DG1, a silicon oxide-silicon nitride-silicon oxide stacked layer 12a and two insulating layers 14a/14b. The first dummy memory gate DG1 is disposed within the resistor region R of the substrate 10. The silicon oxide-silicon nitride-silicon oxide stacked layer 12a is disposed between the first dummy memory gate DG1 and the substrate 10. Two insulating layers 14a/14b are respectively disposed at two sides of the first dummy memory gate DG1 and contact the first dummy memory gate DG1. The insulating layers 14a/14b can be stacked layers formed by silicon oxide and silicon nitride. The silicon oxide within the aforesaid stacked layers contacts the first dummy memory gate DG1. The second dummy memory gate DM2 includes a second dummy memory gate DG2, a silicon oxide-silicon nitride-silicon oxide stacked layer 12b and two insulating layers 14c/14d. The second dummy memory gate DG2 is disposed within the resistor region R of the substrate 10, and at one side of the first dummy memory gate DG1. The silicon oxide-silicon nitride-silicon oxide stacked layer 12b is disposed between the second dummy memory gate DG2 and the substrate 10. Two insulating layers 14c/14d are respectively disposed at two sides of the second dummy memory gate DG2 and contact the second dummy memory gate DG2. It should be noted that the structure of the first dummy memory gate structure DM1 and the structure of the second dummy memory gate structure DM2 within the resistor region R are not limited to the structures mentioned above. Other types of gate structures of 1.5T embedded split-gate flash can also be applied to the first dummy memory gate structure DM1 and the second dummy memory gate structure DM2.

A polysilicon resistor RE is disposed between the first dummy memory gate structure DM1 and the second dummy memory gate structure DM2, and the polysilicon resistor RE contacts the insulating layer 14b of first dummy memory gate structure DM1 and the insulating layer 14c of the second dummy memory gate structure DM2. The polysilicon resistor RE is within the resistor region R, and the top surface of the polysilicon resistor RE is preferably a concave arc. A silicon oxide layer 16 is disposed between the polysilicon resistor RE and the substrate 10. Moreover, a first dummy select gate structure DS1 is disposed at one side of the first dummy memory gate structure DM1. The first dummy select gate structure DS1 includes a first dummy select gate DSG1 and the silicon oxide layer 16. The silicon oxide layer 16 is disposed between the first dummy select gate DSG1 and the substrate 10. The insulating layer 14a is sandwiched between the first dummy select gate structure DS1 and the first dummy memory gate structure DM1. The insulating layer 14b is sandwiched between the first dummy memory gate structure DM1 and the polysilicon resistor RE. The top surface of the silicon nitride layer of the insulating layer 14a is higher than the top surface of the silicon nitride layer of the insulating layer 14b. The first dummy select gate structure DS1 and the polysilicon resistor RE are at different sides of the first dummy memory gate structure DM1. The first dummy select gate structure DS1 contacts the insulating layer 14a of the first dummy memory gate structure DM1. It should be noted that the first dummy memory gate structure DM1, the second dummy memory gate structure DM2, and the first dummy select gate structure DS1 do not have actual gate function.

Furthermore, a split-gate memory 20 is disposed within the flash region F. The split-gate memory 20 includes a first memory gate structure M1, a first select gate structure S1, a first source/drain doping region 18a and a second source/drain doping region 18b. The first memory gate structure M1 includes a first memory gate MG1, a silicon oxide-silicon nitride-silicon oxide stacked layer 12c and two insulating layers 14e/14f. The first memory gate structure M1 has a first side and a second side. The first side is opposed to the second side. The first select gate structure S1 is disposed at the second side of the first memory gate structure M1 and contacts the first memory gate structure M1. The first select gate structure S1 includes a first select gate SG1 and the silicon oxide layer 16. The silicon oxide layer 16 is between the first select gate SG1 and the substrate 10. The first source/drain doping region 18a is disposed within the substrate 10 at the first side of the first memory gate structure M1. The second source/drain doping region 18b is disposed within the substrate 10 at one side of the first select gate structure S1

In addition, a second memory gate structure M2 is disposed at the first side of the first memory gate structure M1. The first source/drain doping region 18a is disposed between the second memory gate structure M2 and the first memory gate structure M1. The second memory gate structure M2 and the first select gate structure S1 are disposed at two different sides of the first memory gate structure M1. The second memory gate structure M2 includes a second memory gate MG2, a silicon oxide-silicon nitride-silicon oxide stacked layer 12d, and two insulating layers 14g/14h. The silicon oxide-silicon nitride-silicon oxide stacked layer 12d is disposed between the second memory gate MG2 and the substrate 10. Two insulating layers 14g/14h are respectively disposed at two sides of the second memory gate MG2. Moreover, the first dummy memory gate DG1, the second dummy memory gate DG2, the first dummy select gate DSG1, the first memory gate MG1, the second memory gate MG2 and the first select gate SG1 are all made of the same material. According to a preferred embodiment of the present invention, the first dummy memory gate DG1, the second dummy memory gate DG2, the first dummy select gate DSG1, the first memory gate MG1, the second memory gate MG2 and the first select gate SG1 are all made of polysilicon.

Moreover, a first shortest distance L1 is between the second memory gate structure M2 and the first memory gate structure M1, a second shortest distance L2 is between the first dummy memory gate structure DM1 and the second dummy memory gate structure DM2. It is noted worthy that the second shortest distance L2 is smaller than the first shortest distance L1. The first shortest distance L1 refers to a shortest distance between the insulating layer 14e of the first memory gate structure M1 and the insulating layer 14h of the second memory gate structure M2 along a horizontal direction X. The second shortest distance L2 refers to a shortest distance between the insulating layer 14b of the first dummy memory gate structure DM1 and the insulating layer 14c of the second dummy memory gate structure DM2 along the horizontal direction X.

A fabricating method of a resistor between dummy flash structures of the present invention will be illustrated in the following FIG. 2 to FIG. 5, wherein elements which are substantially the same as those in the embodiment of FIG. 1 are denoted by the same reference numerals; an accompanying explanation is therefore omitted.

Figure 2:
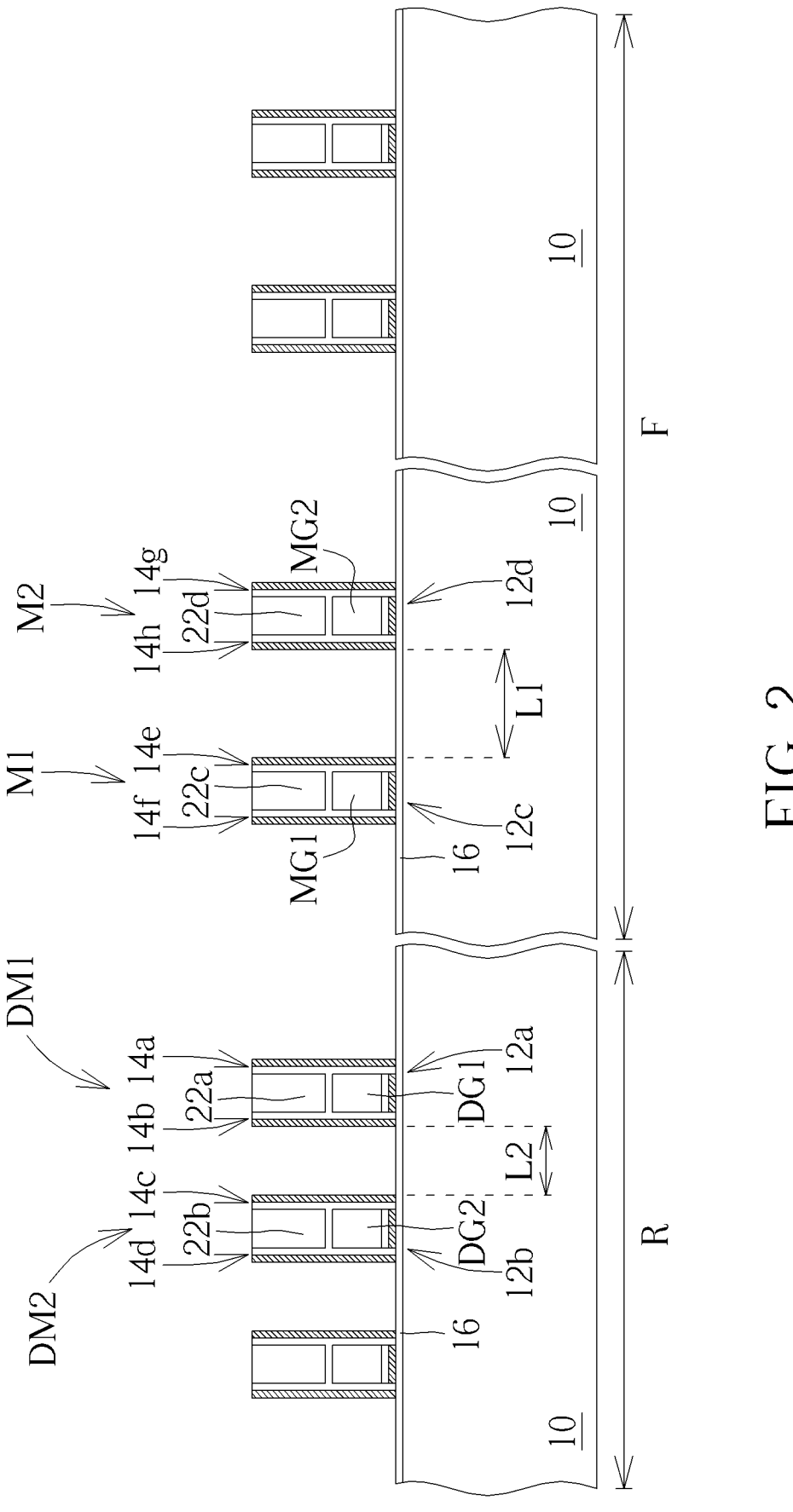
Figure 3:
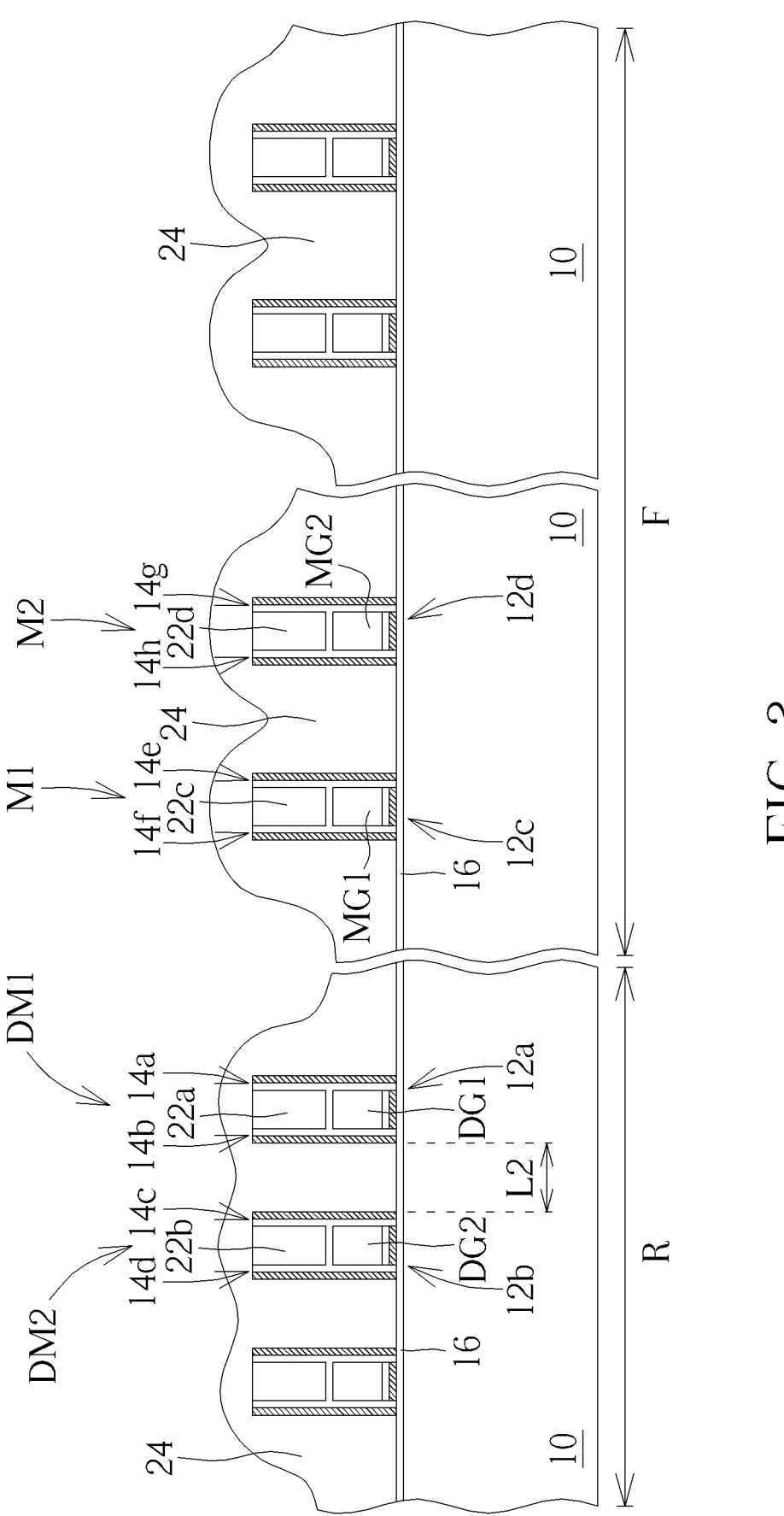
Figure 4:
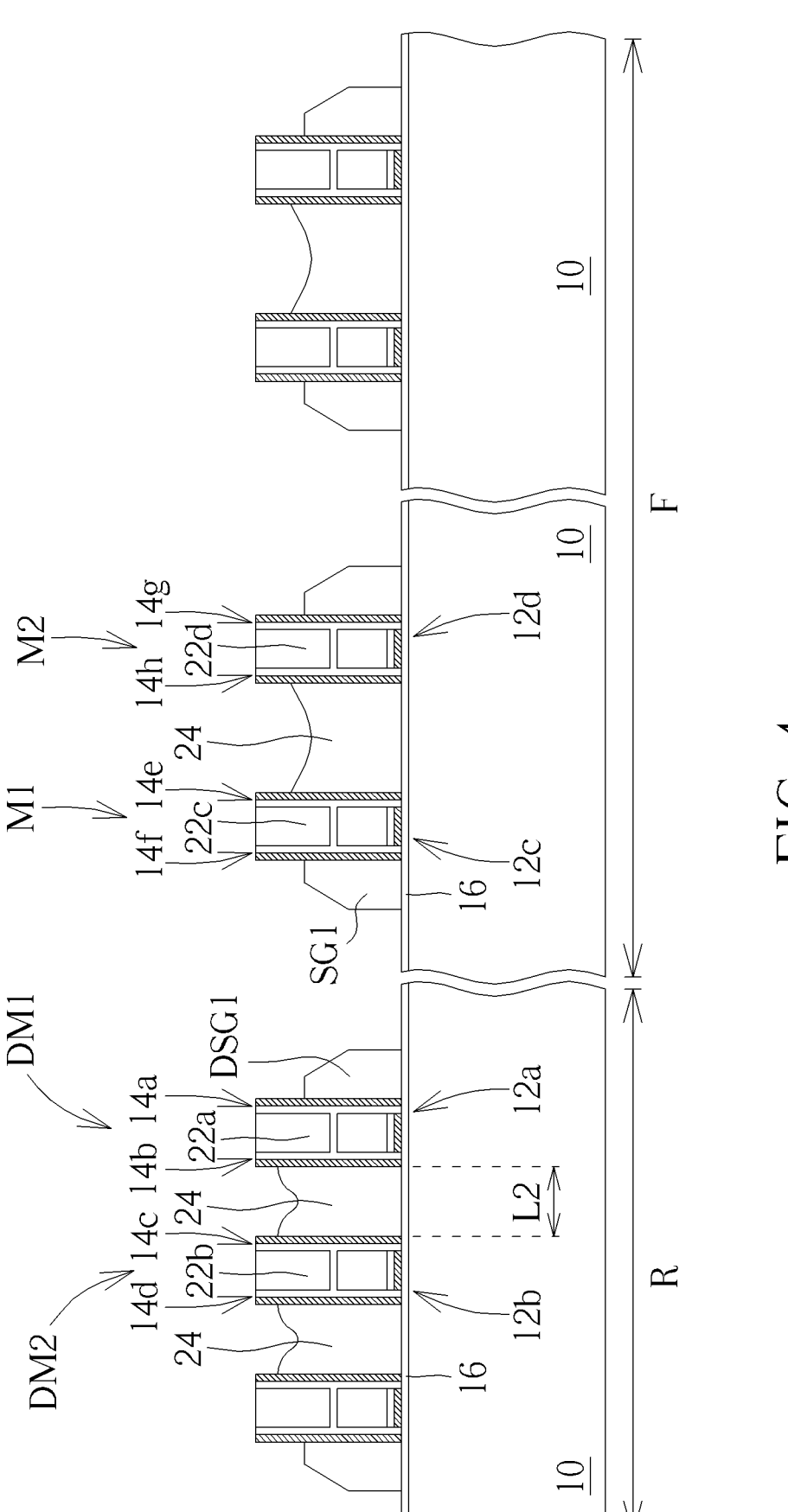

As shown in FIG. 2, a substrate 10 is provided. The substrate 10 is divided into a resistor region R and a flash region F. A silicon oxide layer 16 covers the substrate 10. A first dummy memory gate structure DM1 and a second dummy memory gate structure DM2 are disposed within the resistor region R of the substrate 10. A first memory gate structure M1 and a second memory gate structure M2 are disposed within the flash region F of the substrate 10. The silicon oxide layer 16 is the bottommost silicon oxide of the silicon oxide-silicon nitride-silicon oxide stacked layers 12c/12d/12a/12b respectively belonging to the first memory gate structure M1, the second memory gate structure M2, the first dummy memory gate structure DM1 and the second dummy memory gate structure DM2. A first memory gate MG1, a second memory gate MG2, a first dummy memory gate DG1 and a second dummy memory gate DG2 are respectively disposed on the silicon oxide-silicon nitride-silicon oxide stacked layers 12c/12d/12a/12b. Moreover, cap layers 22c/22d/22a/22b are respectively disposed on the first memory gate structure M1, the second memory gate structure M2, the first dummy memory gate structure DM1 and the second dummy memory gate structure DM2. Insulating layers 14e/14f are respectively disposed at two sides of the first memory gate MG1 and extend to the cap layer 22c. Insulating layers 14g/14h are respectively disposed at two sides of the second memory gate MG2 and extend to the cap layer 22d. Insulating layers 14a/14b are respectively disposed at two sides of the first dummy memory gate DG1 and extend to the cap layer 22a. Insulating layers 14c/14d are respectively disposed at two sides of the second dummy memory gate DG2 and extend to the cap layer 22b. A first shortest distance L1 is between the second memory gate structure M2 and the first memory gate structure M1, a second shortest distance L2 is between the first dummy memory gate structure DM1 and the second dummy memory gate structure DM2. The second shortest distance L2 is smaller than the first shortest distance L1. As shown in FIG. 3, a polysilicon layer 24 is formed to conformally cover the first dummy memory gate structure DM1, the second dummy memory gate structure DM2, the first memory gate structure M1, the second memory gate structure M2 and the substrate 10. As shown in FIG. 4, steps of defining select gate structure are performed. The steps include anisotropic etching the polysilicon layer 24 within the resistor region R and the flash region F in a self-aligned manner by taking the cap layers 22a/22b/22c/22d as masks. Because the first dummy memory gate structure DM1 and the second dummy memory gate structure DM2 are closer to each other, and the first memory gate structure M1 and the second memory gate structure M2 are farther from each other, i.e. the second shortest distance L2 is smaller than the first shortest distance L1, the etching rate of the polysilicon 24 between first dummy memory gate structure DM1 and the second dummy memory gate structure DM2 is smaller than the etching rate of the polysilicon 24 between the first memory gate structure M1 and the second memory gate structure M2. In the same etching time, the remaining polysilicon layer 24 between first dummy memory gate structure DM1 and the second dummy memory gate structure DM2 has a greater height. The remaining polysilicon layer 24 between first memory gate structure M1 and the second memory gate structure M2 has a smaller height. The remaining polysilicon layer 24 which has only one side contacting the gate structures also has a smaller height than that of the remaining polysilicon layer 24 between first dummy memory gate structure DM1 and the second dummy memory gate structure DM2. The remaining polysilicon layer 24 which has only one side contacting the gate structures will serve as select gates such as a first dummy select gate DSG1 and a first elect gate SG1 afterwards. In details, the height of the polysilicon layer 24 remained between the first dummy memory gate structure DM1 and the second dummy memory gate structure DM2 relates to the size of the second shortest distance L2. Therefore, the height of the polysilicon layer 24 remained between the first dummy memory gate structure DM1 and the second dummy memory gate structure DM2 can be adjusted by altering the second shortest distance L2.

Figure 5:
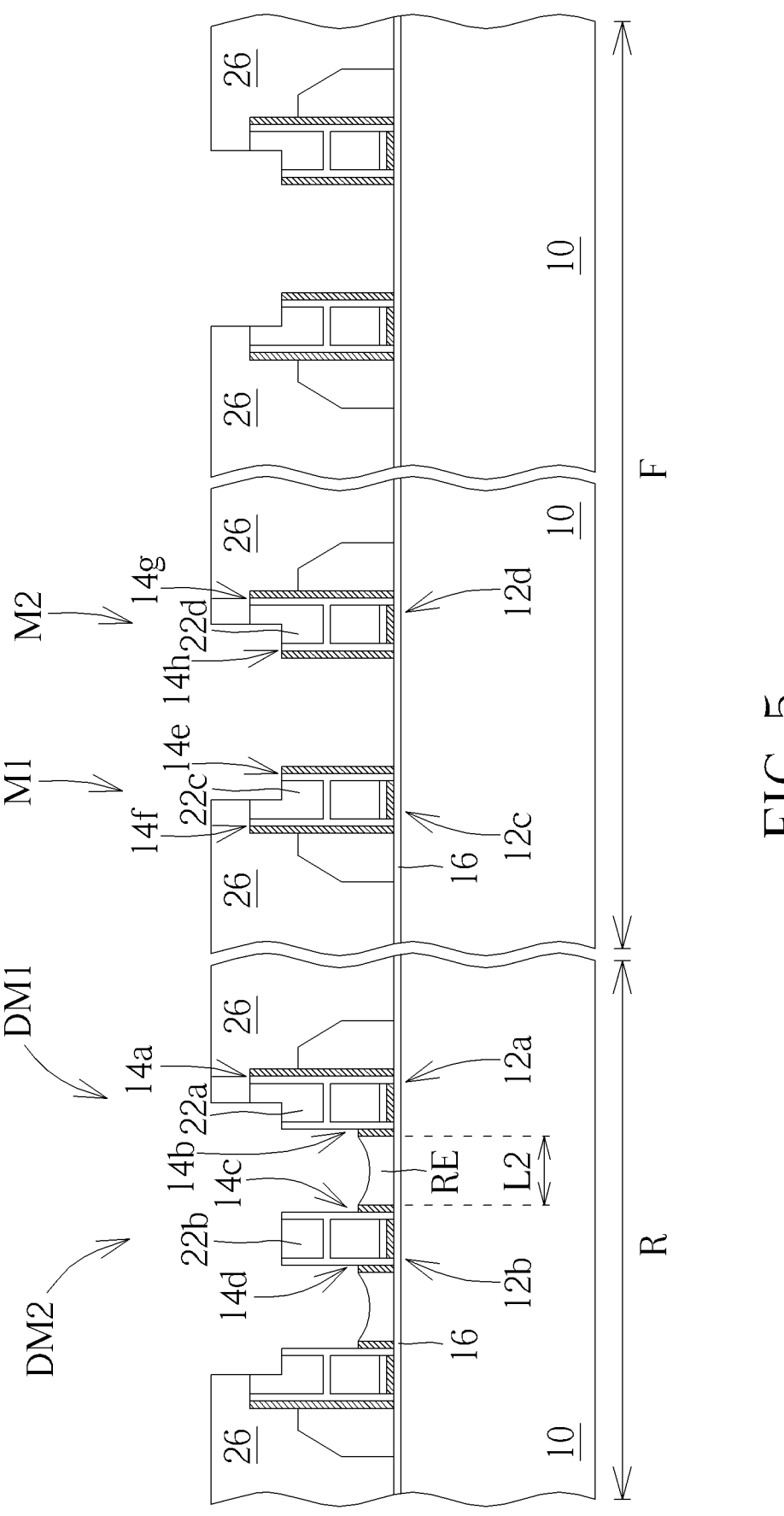

As shown in FIG. 5, a photoresist 26 is formed. Then, the photoresist 26 is patterned to expose the region between two adjacent gate structures. For example, the region between the first memory gate structure M1 and the second memory gate structure M2, and the region between the first dummy memory gate structure DM1 and the second dummy memory gate structure DM2 are exposed. After that, the entire polysilicon layer 24 is etched until the polysilicon layer 24 between the first memory gate structure M1 and the second memory gate structure M2 are completely removed. As mentioned above, the height of the polysilicon layer 24 remained between the first dummy memory gate structure DM1 and the second dummy memory gate structure DM2 is greater, therefore, when the polysilicon layer 24 between the first memory gate structure M1 and the second memory gate structure M2 is entirely removed, there is still some poly-silicon layer 24 remained between the first dummy memory gate structure DM1 and the second dummy memory gate structure DM2. The polysilicon layer 24 which is remained will serve as a polysilicon resistor RE. Now, a resistor between dummy flash structures of the present invention is completed.

Figure 6:
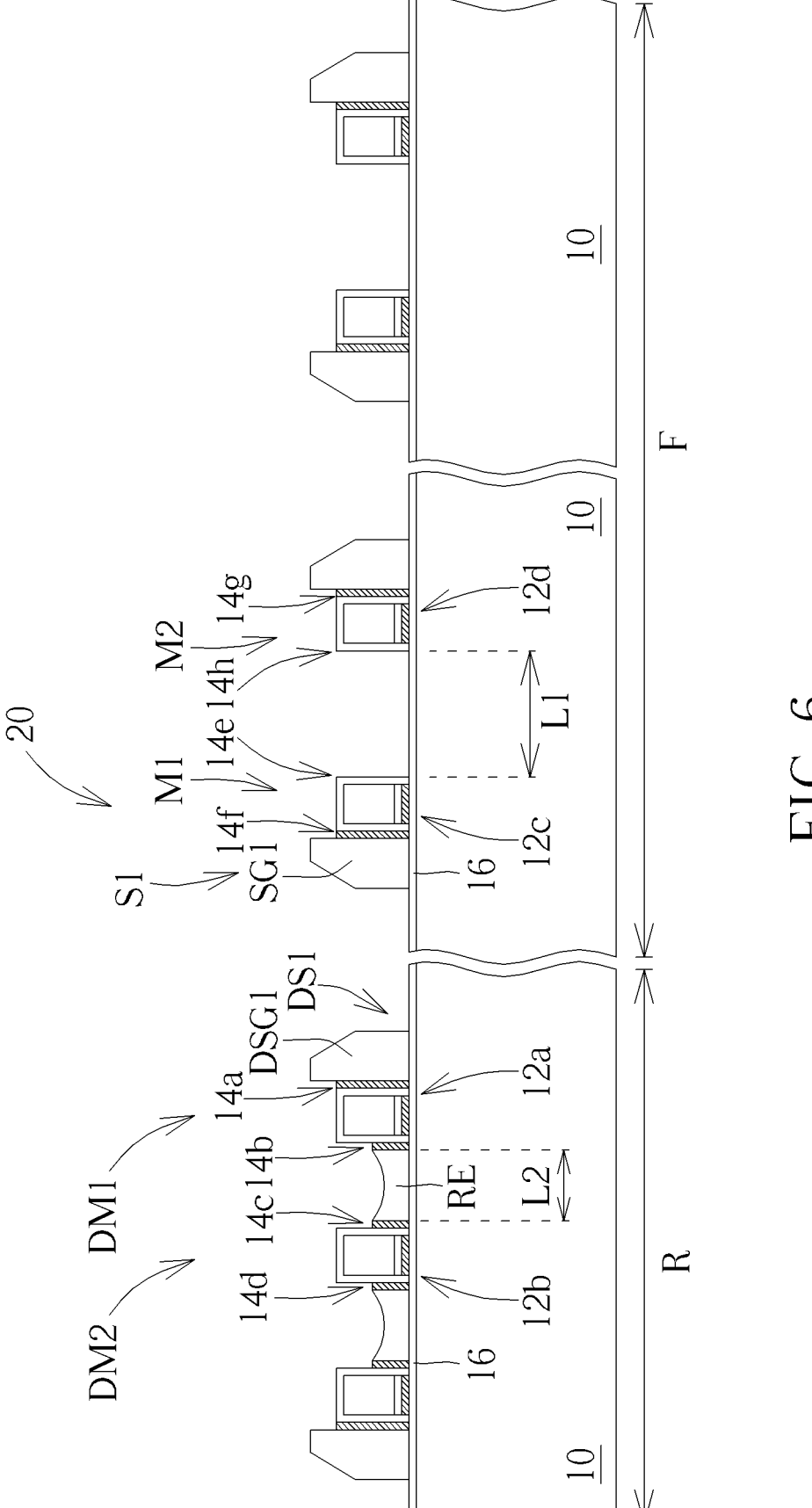
FIG. 6 shows a continuous stage of FIG. 5.

As shown in FIG. 6, after the photoresist layer 26 is removed, the cap layers 22a/22b/22c/22d are removed. Finally, as shown in FIG. 1, an implantation process is performed to the flash region F to form a first source/drain doping region 18a between the first memory gate structure M1 and the second memory gate structure M2, and a second source/drain doping region 18b in the substrate 10 at a side of the first select gate structure S1. Now, a split-gate memory 20 is completed. Moreover, there is no doping region formed within the resistor region R.

The present invention forms polysilicon resistor RE along with the fabricating process of a split-gate memory 20. In this way, extra fabricating process is not needed. By adjust-ing the second shorted distance L2 between the first dummy memory gate structure DM1 and the second dummy memory gate structure DM2, the height of the polysilicon resistor RE can be adjusted, and the resistance of the polysilicon resistor RE can be controlled.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A resistor between dummy flash structures, comprising:
a substrate comprising a resistor region and a flash region;
a first dummy memory gate structure and a second dummy memory gate structure disposed within the resistor region of the substrate;
a polysilicon resistor disposed between the first dummy memory gate structure and the second dummy memory gate structure, and the polysilicon resistor contacting the first dummy memory gate structure and the second dummy memory gate structure; and
a first dummy select gate structure disposed at one side of the first dummy memory gate structure, and the first dummy select gate structure contacting the first dummy memory gate structure.

2. The resistor between dummy flash structures of claim 1, further comprising a silicon oxide layer disposed between the polysilicon resistor and the substrate.

3. The resistor between dummy flash structures of claim 1, wherein the first dummy memory gate structure com-prises:
a first dummy memory gate disposed within the resistor region;
a silicon oxide-silicon nitride-silicon oxide stacked layer disposed between the first dummy memory gate and the substrate; and
two insulating layers respectively disposed at two sides of the first dummy memory gate and contacting the first dummy memory gate.

4. The resistor between dummy flash structures of claim 1, further comprising a split-gate memory, wherein the split-gate memory comprises:
a first memory gate structure; and
a first select gate structure disposed at a second side of the first memory gate structure.

5. The resistor between dummy flash structures of claim 4, wherein the split-gate memory further comprises:
a first source/drain doping region disposed within the substrate which is at a first side of the first memory gate structure, wherein the first side is opposed to the second side; and
a second source/drain doping region disposed within the substrate which is at a side of the first select gate structure.

6. The resistor between dummy flash structures of claim 5, further comprising a second memory gate structure dis-posed at the first side of the first memory gate structure, wherein a first shortest distance is between the second memory gate structure and the first memory gate structure, a second shortest distance is between the first dummy memory gate structure and the second dummy memory gate structure, and the second shortest distance is smaller than the first shortest distance.

7. The resistor between dummy flash structures of claim 4, wherein the first dummy gate structure comprises a first dummy memory gate, the first memory gate structure com-prises a first memory gate, and the first dummy memory gate and the first memory gate are made of the same material.

8. The resistor between dummy flash structures of claim 7, wherein the first dummy memory gate and the first memory gate are made of polysilicon.

9. The resistor between dummy flash structures of claim 7, wherein the first dummy gate structure further comprises a silicon oxide layer disposed between the first dummy memory gate and the substrate, and wherein the silicon oxide layer extends from the first dummy memory gate structure, the silicon oxide layer is positioned beneath the polysilicon resistor, and the polysilicon resistor contacts the silicon oxide layer.

10. The resistor between dummy flash structures of claim 4, wherein the first memory gate structure comprises:

a first memory gate disposed within the flash region of the substrate; and a silicon oxide-silicon nitride-silicon oxide stacked layer disposed between the first memory gate and the substrate.

11. A resistor between dummy flash structures, comprising:

a substrate comprising a resistor region and a flash region;

a first dummy memory gate structure and a second dummy memory gate structure disposed within the resistor region of the substrate;

a polysilicon resistor disposed between the first dummy memory gate structure and the second dummy memory gate structure, and the polysilicon resistor contacting the first dummy memory gate structure and the second dummy memory gate structure; and a split-gate memory, wherein the split-gate memory comprises:

a first memory gate structure; and a first select gate structure disposed at a second side of the first memory gate structure.

12. The resistor between dummy flash structures of claim 11, further comprising a first dummy select gate structure disposed at one side of the first dummy memory gate structure, and the first dummy select gate structure contacting the first dummy memory gate structure.

13. The resistor between dummy flash structures of claim 11, further comprising a silicon oxide layer disposed between the polysilicon resistor and the substrate.

14. The resistor between dummy flash structures of claim 11, wherein the first dummy memory gate structure comprises:

a first dummy memory gate disposed within the resistor region;

a silicon oxide-silicon nitride-silicon oxide stacked layer disposed between the first dummy memory gate and the substrate; and two insulating layers respectively disposed at two sides of the first dummy memory gate and contacting the first dummy memory gate.

15. The resistor between dummy flash structures of claim 11, wherein the split-gate memory further comprises:

a first source/drain doping region disposed within the substrate which is at a first side of the first memory gate structure, wherein the first side is opposed to the second side; and a second source/drain doping region disposed within the substrate which is at a side of the first select gate structure.

16. The resistor between dummy flash structures of claim 15, further comprising a second memory gate structure disposed at the first side of the first memory gate structure, wherein a first shortest distance is between the second memory gate structure and the first memory gate structure, a second shortest distance is between the first dummy memory gate structure and the second dummy memory gate structure, and the second shortest distance is smaller than the first shortest distance.

17. The resistor between dummy flash structures of claim 11, wherein the first dummy gate structure comprises a first dummy memory gate, the first memory gate structure comprises a first memory gate, and the first dummy memory gate and the first memory gate are made of the same material.

18. The resistor between dummy flash structures of claim 17, wherein the first dummy memory gate and the first memory gate are made of polysilicon.

19. The resistor between dummy flash structures of claim 17, wherein the first dummy gate structure further comprises a silicon oxide layer disposed between the first dummy memory gate and the substrate, and wherein the silicon oxide layer extends from the first dummy memory gate structure, the silicon oxide layer is positioned beneath the polysilicon resistor, and the polysilicon resistor contacts the silicon oxide layer.

20. The resistor between dummy flash structures of claim 1, wherein the first memory gate structure comprises:

a first memory gate disposed within the flash region of the substrate; and a silicon oxide-silicon nitride-silicon oxide stacked layer disposed between the first memory gate and the substrate.

\* \* \* \* \*